US010535297B2

(12) United States Patent
Cheng

(10) Patent No.: US 10,535,297 B2
(45) Date of Patent: Jan. 14, 2020

(54) DISPLAY COMPRISING AN IRREGULAR-SHAPE ACTIVE AREA AND METHOD OF DRIVING THE DISPLAY

(71) Applicant: INT TECH CO., LTD., Taipei (TW)

(72) Inventor: Shih-Song Cheng, Kaohsiung (TW)

(73) Assignee: INT TECH CO., LTD., Taipei (TW)

( * ) Notice: Subject to any disclaimer, the term of this patent is extended or adjusted under 35 U.S.C. 154(b) by 0 days.

(21) Appl. No.: 15/439,547

(22) Filed: Feb. 22, 2017

(65) Prior Publication Data

US 2018/0137800 A1 May 17, 2018

Related U.S. Application Data

(60) Provisional application No. 62/421,435, filed on Nov. 14, 2016.

(51) Int. Cl.
*G06F 1/00* (2006.01)
*G09G 3/20* (2006.01)
*G06F 3/14* (2006.01)
*H01L 23/528* (2006.01)
*H01L 27/32* (2006.01)
*H01L 29/78* (2006.01)
(Continued)

(52) U.S. Cl.
CPC ......... *G09G 3/2092* (2013.01); *G06F 3/1446* (2013.01); *G09G 3/30* (2013.01); *H01L 23/528* (2013.01); *H01L 27/3211* (2013.01); *H01L 27/3248* (2013.01); *H01L 29/41733* (2013.01); *H01L 29/78* (2013.01); *H01L 51/5036* (2013.01); *G09G 3/3208* (2013.01); *G09G 3/3611* (2013.01); *G09G 2300/026* (2013.01);
(Continued)

(58) Field of Classification Search
CPC .......... G09G 3/32; G09G 3/20; G02F 1/1343; G02F 1/1335
See application file for complete search history.

(56) References Cited

U.S. PATENT DOCUMENTS 8,432,523 B2   4/2013 Shin et al.
8,958,044 B2   2/2015 Takatori
(Continued)

FOREIGN PATENT DOCUMENTS

CN   101419349 A   4/2009
CN   105470264 A   4/2016
(Continued)

OTHER PUBLICATIONS

Office action and search report dated Jul. 10, 2018, from Taiwan corresponding application 106129045, 3 pp., with 1 p. English translation.
(Continued)

*Primary Examiner* — Michael A Faragalla
(74) *Attorney, Agent, or Firm* — Juan Carlos A. Marquez; Marquez IP Law Office, PLLC

(57) ABSTRACT

A display that includes circuit an irregular-shape active area, pixel units, first gate drivers, second gate drivers and a data driver is disclosed. The pixel units are arranged in rows and columns in the irregular-shape active area. Each of the first gate drivers is configured to scan a corresponding row of the pixel units. Each of the second gate drivers is configured to scan a corresponding column of the pixel units. The data driver is configured to provide data to a pixel unit selected by the first gate drivers and the second gate drivers.

20 Claims, 7 Drawing Sheets

(51) Int. Cl.
  *H01L 51/50* (2006.01)
  *G09G 3/30* (2006.01)
  *H01L 29/417* (2006.01)
  *G09G 3/36* (2006.01)
  *G09G 3/3208* (2016.01)

(52) U.S. Cl.
  CPC .............. *G09G 2300/0439* (2013.01); *G09G 2300/0819* (2013.01); *G09G 2310/0278* (2013.01); *G09G 2320/0204* (2013.01); *G09G 2320/029* (2013.01); *G09G 2320/0233* (2013.01); *G09G 2320/045* (2013.01); *G09G 2330/02* (2013.01); *H01L 27/3244* (2013.01)

(56) References Cited

U.S. PATENT DOCUMENTS 9,875,721 B2 *   1/2018   Lee .................. G09G 5/003
2012/0176051 A1  7/2012   Takatori
2015/0042703 A1*  2/2015   Chaji .................. G09G 3/3233
                                                    345/694
2016/0189664 A1   6/2016   Lee et al.
2016/0335952 A1  11/2016   Chaji et al.
2017/0160603 A1*  6/2017   Zhang ............... G02F 1/133512

FOREIGN PATENT DOCUMENTS

CN    105474296 A    4/2016
TW    201640476 A   11/2016
TW    201640708 A   11/2016

OTHER PUBLICATIONS

Office action dated Apr. 22, 2019 with search report dated Apr. 12, 2019, from Chinese corresponding application 2017107786377, 9 pages in Chinese, with 3 pages of English translation.

* cited by examiner

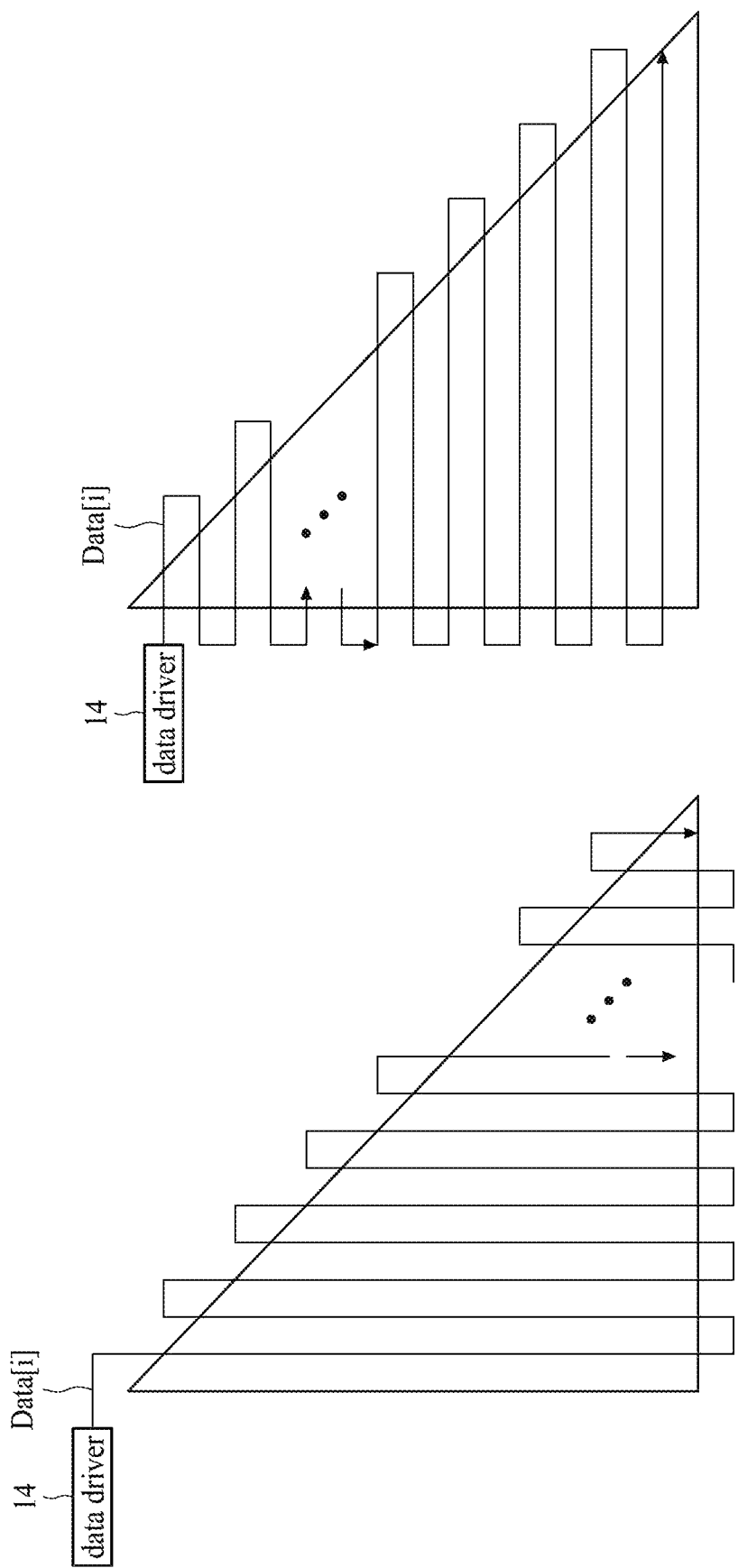

DISPLAY COMPRISING AN IRREGULAR-SHAPE ACTIVE AREA AND METHOD OF DRIVING THE DISPLAY

CROSS REFERENCE TO RELATED APPLICATIONS

This application claims priority to U.S. provisional application Ser. No. 62/421,435, filed Nov. 14, 2016, the disclosure of which is hereby incorporated herein by reference.

BACKGROUND

A display for presentation of an image may include pixels arranged in rows and columns in a matrix. Each row of the pixels is coupled via a gate line (or scan line) to a gate driver, while each column of the pixels is coupled via a data line (or source line) to a data driver. The gate drivers select corresponding rows of pixels of interest via their respective gate lines. The data drivers provide data to corresponding columns of pixels in the selected rows via their respective data lines.

SUMMARY

Embodiments of the present invention provide a display. The display includes an irregular-shape active area, pixel units arranged in rows and columns in the irregular-shape active area, first gate drivers each configured to scan a corresponding row of the pixel units, second gate drivers each configured to scan a corresponding column of the pixel units, and a data driver configured to provide data to a pixel unit selected by the first gate drivers and the second gate drivers.

In an embodiment, the first gate drivers are arranged in a row direction, and the second gate drivers are arranged in a column direction.

In another embodiment, each of the first gate drivers is configured to scan a corresponding row of the pixel units via a corresponding first gate line.

In yet another embodiment, the corresponding first gate line extends in a row direction.

In still another embodiment, each of the second gate drivers is configured to scan a corresponding column of the pixel units via a corresponding second gate line.

In yet still another embodiment, the corresponding second gate line extends in a column direction.

In an embodiment, the data driver is configured to provide data to a pixel unit via a data line that serially connects all of the pixel units in the active area.

In another embodiment, the data line extends in a column direction through pixel units from one column to another.

In yet another embodiment, the data line extends in a row direction through pixel units from one row to another.

In still another embodiment, the irregular-shape active area includes one of a triangle, circle, semi-circle, diamond, rhombus, parallelogram and quadrangle.

Some embodiments of the present invention provide a display that includes display units. Each of the display units further includes an irregular-shape active area, pixel units arranged in rows and columns in the irregular-shape active area, first gate drivers each configured to scan a corresponding row of the pixel units, second gate drivers each configured to scan a corresponding column of the pixel units, and a data driver configured to provide data to a pixel unit selected by the first gate drivers and the second gate drivers.

Embodiments of the present invention also provide a method of driving a display. The method comprises providing a display that comprises pixel units arranged in rows and columns in an irregular-shape active area, selecting pixel units of interest by first gate drivers associated with the rows of pixel units and by second gate drivers associated with the columns of pixel units, and providing data to the selected pixel units of interest via a data line that serially connecting the pixel units in the irregular-shape active area.

In an embodiment, selecting pixel units of interest comprises scanning the rows of pixel units by the first gate drivers, and scanning the columns of pixel units by the second gate drivers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a schematic diagram showing a data line and a data driver in the display illustrated in FIG. 1, in accordance with an embodiment.

FIG. 3B is a schematic diagram showing a data line and a data driver in the display illustrated in FIG. 1, in accordance with another embodiment.

DETAILED DESCRIPTION

Figure 1:
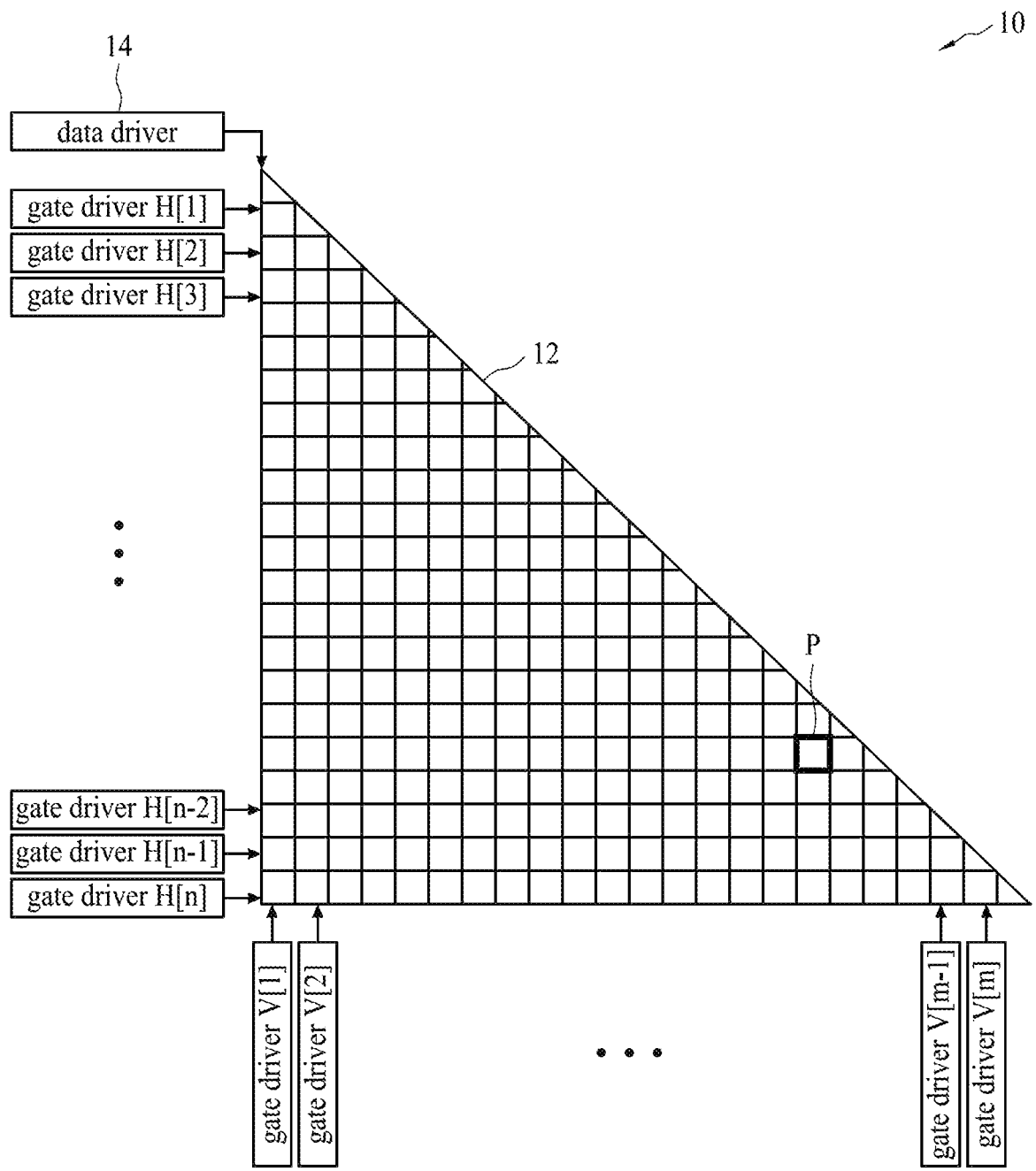
FIG. 1 is a schematic diagram of a display including an irregular-shape active area, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1 is a schematic diagram of a display 10 including an irregular-shape active area 12, in accordance with some embodiments. The display 10 may include a liquid crystal display (LCD) or an electroluminescent (EL) display such as an active matrix organic light emitting diode (AMOLED) display.

Referring to FIG. 1, the display 10 includes an active area 12, a data driver 14, first gate drivers H[1] to H[n] and second gate drivers V[1] to V[m]. Unlike in some existing displays an active area that includes pixels arranged in a square or rectangular array, the active area 12 includes pixel units P arranged in the form of, for example, a triangle. The irregular-shape active area 12 facilitates the display 10 to be applicable to an unfriendly geometric environment where a square or rectangular active area may not snugly fit in, and hence may enhance cost-area efficiency of the display 12. Moreover, the present disclosure is not limited to a specific shape of active area and may take an arbitrary or desired shape. For example, the active area 12 may take the form of a circle, semi-circle, diamond, rhombus, parallelogram or quadrangle. Pixel units in an active area of the desired shape are arranged in rows and columns, even though the number of pixel units may be different from row to row and from column to column.

The first gate drivers H[1] to H[n], which may be arranged in a vertical or column direction, are configured to scan one or more rows of pixel units P. Further, the second gate drivers V[1] to V[m], which may be arranged in a horizontal or row direction, are configured to scan one or more columns of pixel units P. Accordingly, the first gate drivers H[1] to H[n] and the second gate drivers V[1] to V[m] are configured to work in conjunction with each other to select pixel units P of interest. The data driver 14 then provides data to the selected pixel units P.

Figure 2A:
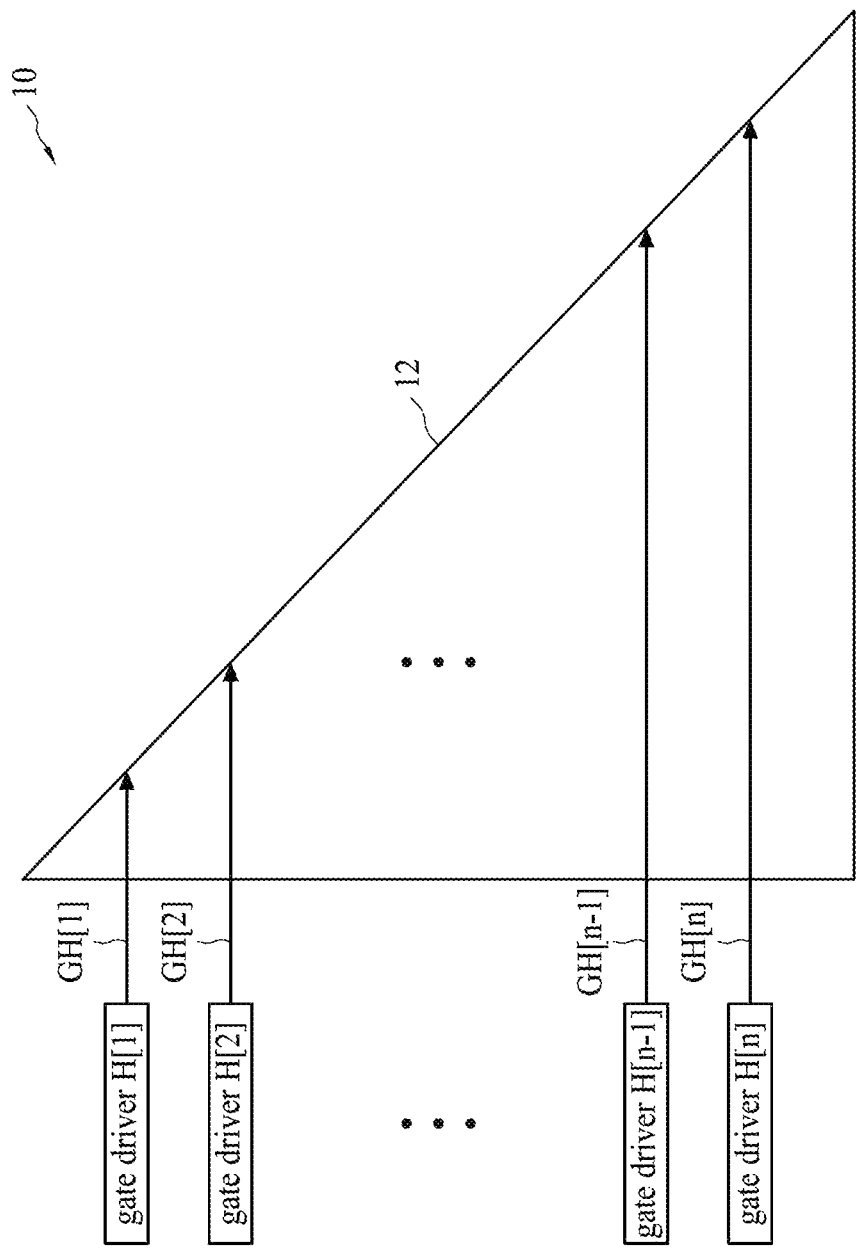
FIG. 2A is a schematic diagram showing first gate lines and their associated first gate drivers in the display illustrated in FIG. 1, in accordance with some embodiments.

FIG. 2A is a schematic diagram showing first gate lines GH[1] to GH[n] and their associated first gate drivers H[1] to H[n] in the display 10 illustrated in FIG. 1, in accordance with some embodiments.

Referring to FIG. 2A, each of the first gate drivers H[1] to H[n] provides a control signal to its corresponding row of pixel units P via a corresponding one of the first gate lines GH[1] to GH[n]. The first gate lines GH[1] to GH[n] substantially extend in a first direction which, in the present embodiment, is the row direction.

Figure 2B:
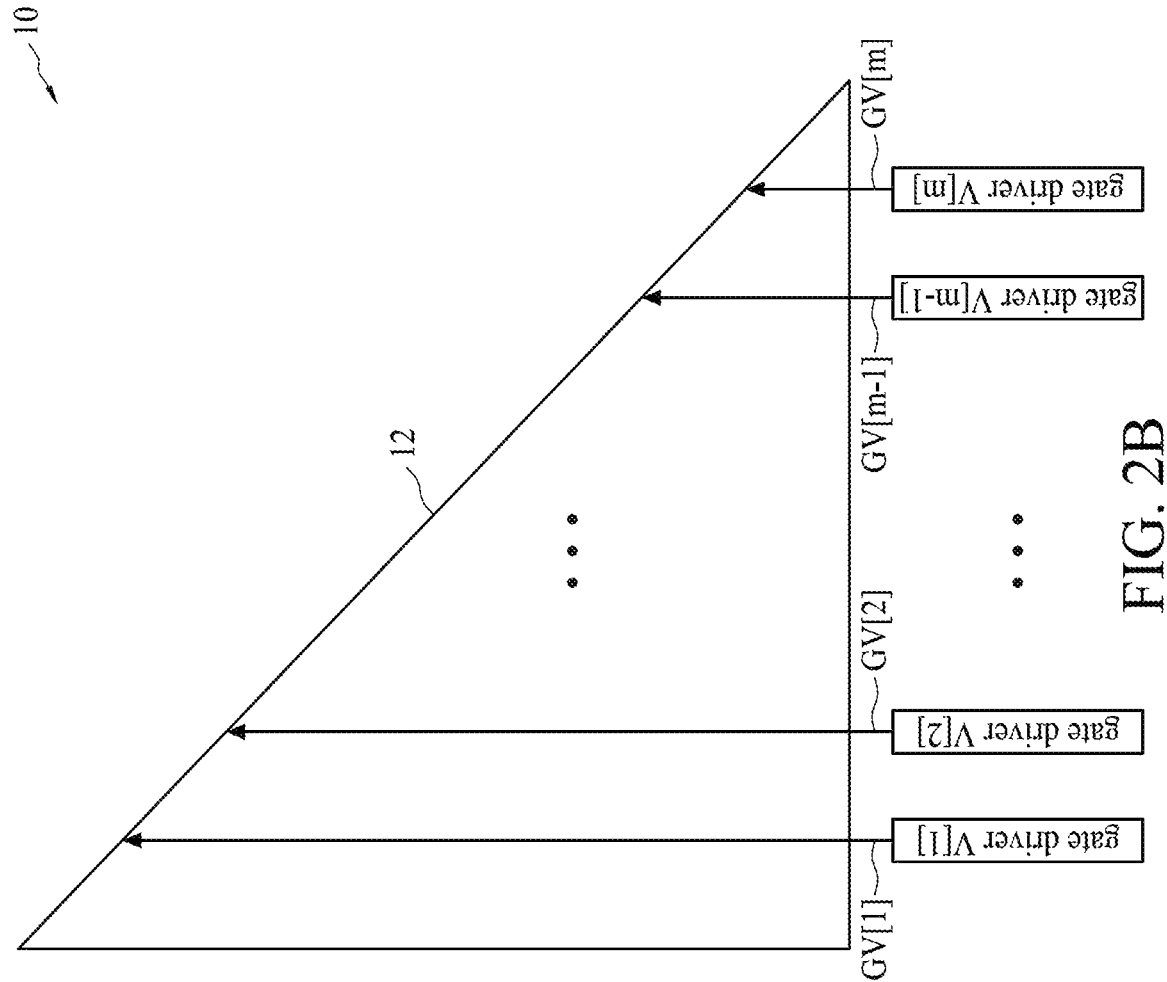
FIG. 2B is a schematic diagram showing second gate lines and their associated second gate drivers in the display illustrated in FIG. 1, in accordance with some embodiments.

FIG. 2B is a schematic diagram showing second gate lines GV[1] to GV[m] and their associated second gate drivers V[1] to V[m] in the display 10 illustrated in FIG. 1, in accordance with some embodiments.

Referring to FIG. 2B, each of the second gate drivers V[1] to V[m] provides a control signal to its corresponding column of pixel units P via a corresponding one of the second gate lines GV[1] to GV[m]. The second gate lines GV[1] to GV[m] substantially extend in a second direction different from the first direction. In the present embodiment, the second direction is the column direction, which is orthogonal to the first direction.

FIG. 3A is a schematic diagram showing a data line Data[i] and the data driver 14 in the display 10 illustrated in FIG. 1, in accordance with an embodiment.

Referring to FIG. 3A, the data driver 14 provides data to a selected pixel unit P via the data line Data[i]. In the present embodiment, the data line Data[i] extends in the column or second direction through pixel units P from one column to another to serially connect all of the pixel units P in the active area 12. Specifically, the data line Data[i] extends vertically from the first column of pixel units P towards the m-th column of pixel units P. Alternatively, the data line Data[i] may extend vertically from the m-th column of pixel units P towards the first column of pixel units P.

FIG. 3B is a schematic diagram showing a data line Data[i] and the data driver 14 in the display 10 illustrated in FIG. 1, in accordance with another embodiment.

Referring to FIG. 3A, the data driver 14 provides data to a selected pixel unit P via the data line Data[i]. In the present embodiment, the data line Data[i] extends in the row or first direction through pixel units P from one row to another to serially connect all of the pixel units P in the active area 12. Specifically, the data line Data[i] extends horizontally from the first row of pixel units P towards the n-th row of pixel units P. Alternatively, the data line Data[i] may extend horizontally from the n-th row of pixel units P towards the first row of pixel units P.

Figure 4:
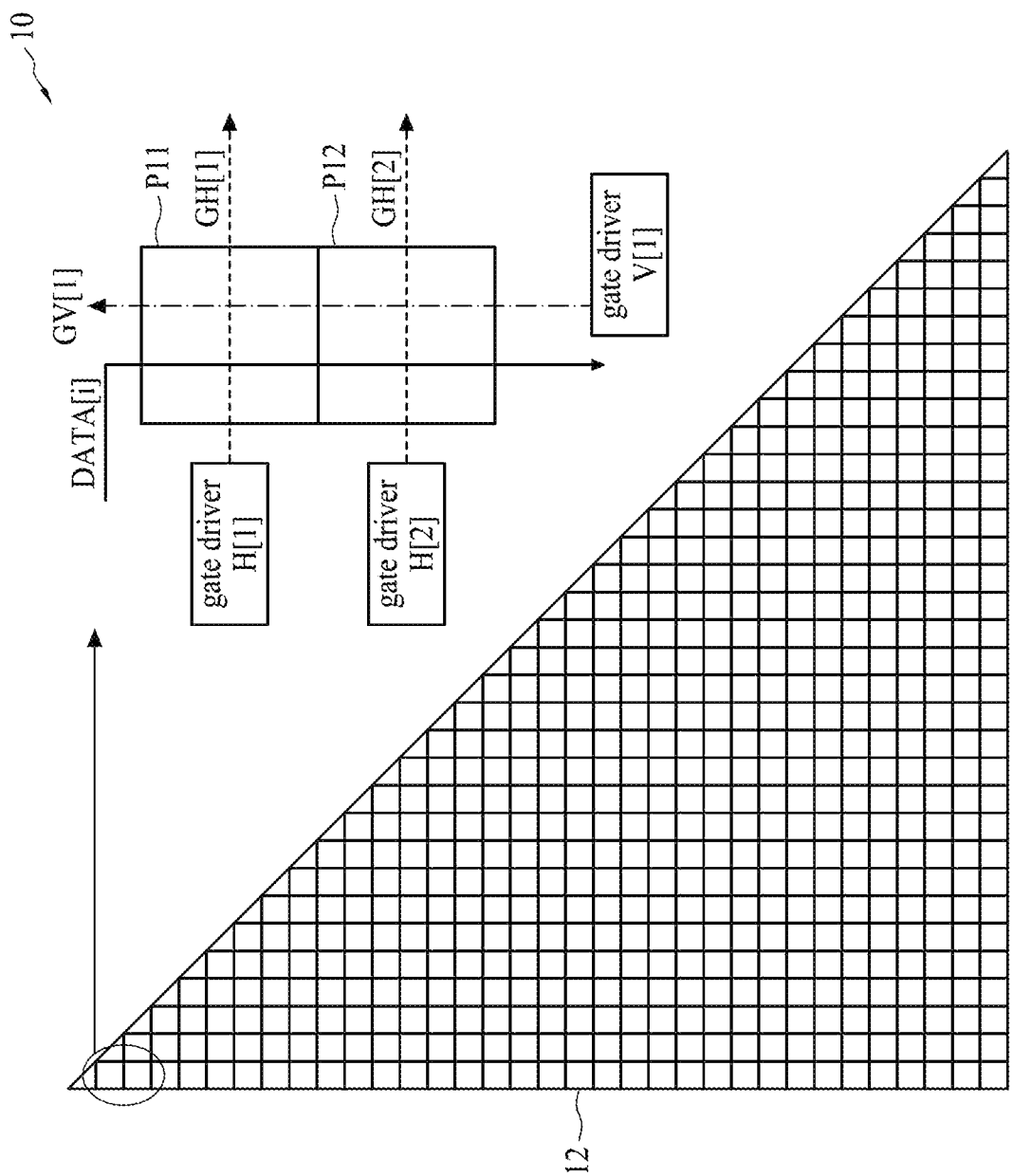
FIG. 4 is an amplified view of pixel units in the display illustrated in FIG. 1, in accordance with some embodiments.

FIG. 4 is an amplified view of pixel units P in the display 10 illustrated in FIG. 1, in accordance with some embodiments. For brevity, only exemplary pixel units P11 and P12 are shown.

Referring to FIG. 4, the pixel unit P11 may be selected by a first gate driver H[1] via a first gate line GH[1] and a second gate driver V[1] via a second gate line GV[1]. Likewise, the pixel unit P12 may be selected by a first gate driver H[2] via a first gate line GH[2] and the second gate driver V[1] via the second gate line GV[1]. The data driver 14 provides data to the pixel units P11 and P12, when selected, via data line Data[i] that serially connects the pixel units P11 and P12.

Figure 5:
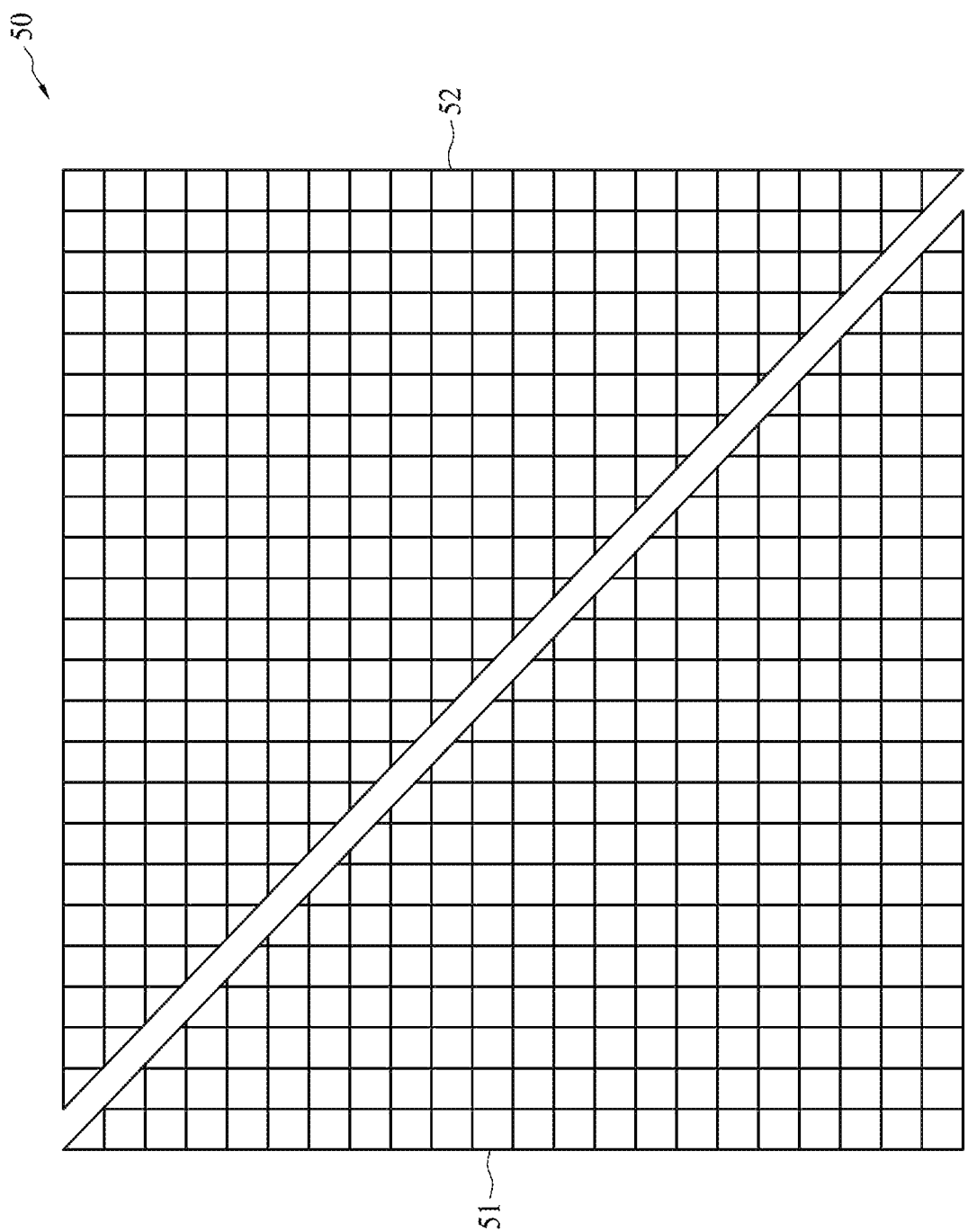
FIG. 5 is a schematic diagram of a display including display units each having an irregular-shape active area, in accordance with some embodiments.

FIG. 5 is a schematic diagram of a display 50 including display units 51 and 52 each having an irregular-shape active area, in accordance with some embodiments.

Referring to FIG. 5, in the present embodiment each of the display units 51 and 52 may be similar to or same as the display 10 described and illustrated with reference to FIG. 1. Similarly, each of the display units 51 and 52 is not limited to the specific triangle shape of active area and may take an arbitrary or desired shape such as a circle, semi-circle, diamond, rhombus, parallelogram or quadrangle. By combining the display units 51 and 52, the display 50 enjoys a larger display area and provides more display flexibility than the display 10.

Figure 6:
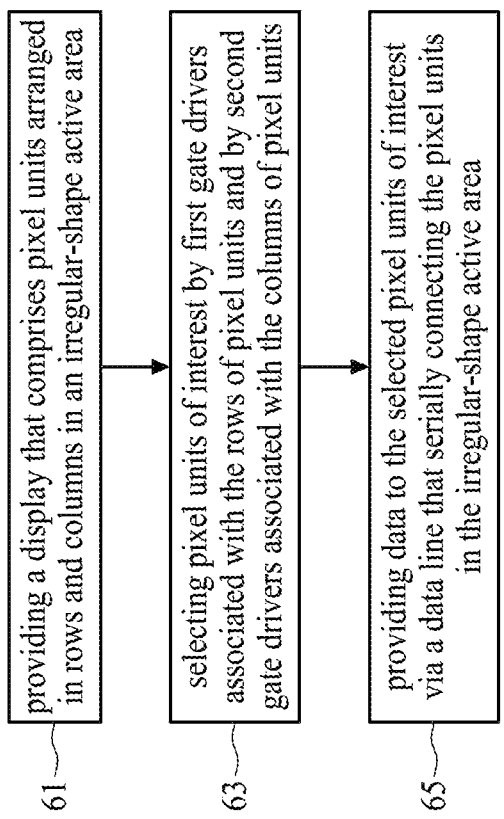
FIG. 6 is a flow diagram showing a method of driving a display including an irregular-shape active area, in accordance with some embodiments.

FIG. 6 is a flow diagram showing a method of driving a display including an irregular-shape active area, in accordance with some embodiments.

Referring to FIG. 6, in operation 61, a display that comprises pixel units arranged in rows and columns in an irregular-shape active area is provided.

In operation 63, pixel units of interest are selected by first gate drivers associated with the rows of pixel units and by second gate drivers associated with the columns of pixel units. Each of the first gate drivers is configured to scan a corresponding row of pixel units, while each of the second gate drivers is configured to scan a corresponding column of pixel units.

In operation 65, data is provided to the selected pixel units of interest via a data line that serially connecting the pixel units in the irregular-shape active area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display, comprising:
    an irregular-shape active area;
    pixel units arranged in rows and columns in the irregular-shape active area;
    first gate drivers each configured to scan a corresponding row of the pixel units to select one or more pixel units in the corresponding row;
    second gate drivers each configured to scan a corresponding column of the pixel units to select one or more pixel units in the corresponding column; and
    a data driver configured to, when a pixel unit arranged in one of the rows and one of the columns is selected by each of one of the first gate drivers and one of the second gate drivers, provide data to the pixel unit arranged in the one of the rows scanned by the one of the first gate drivers and arranged in the one of the columns scanned by the one of the second gate drivers.

2. The display according to claim 1, wherein the first gate drivers are arranged in a row direction, and the second gate drivers are arranged in a column direction.

3. The display according to claim 1, wherein each of the first gate drivers is configured to scan a corresponding row of the pixel units via a corresponding first gate line.

4. The display according to claim 3, wherein the corresponding first gate line extends in a row direction.

5. The display according to claim 1, wherein each of the second gate drivers is configured to scan a corresponding column of the pixel units via a corresponding second gate line.

6. The display according to claim 5, wherein the corresponding second gate line extends in a column direction.

7. The display according to claim 1, wherein the data driver is configured to provide data to a pixel unit via a data line that serially connects all of the pixel units in the active area.

8. The display according to claim 7, wherein the data line extends in a column direction through pixel units from one column to another.

9. The display according to claim 7, wherein the data line extends in a row direction through pixel units from one row to another.

10. The display according to claim 1, wherein the irregular-shape active area includes one of a triangle, circle, semi-circle, diamond, rhombus, parallelogram and quadrangle.

11. A display, comprising:
    display units each further comprising:
    an irregular-shape active area;
    pixel units arranged in rows and columns in the irregular-shape active area;
    first gate drivers each configured to scan a corresponding row of the pixel units to select one or more pixel units in the corresponding row;
    second gate drivers each configured to scan a corresponding column of the pixel units to select one or more pixel units in the corresponding column; and
    a data driver configured to, when a pixel unit arranged in one of the rows and one of the columns is selected by each of one of the first gate drivers and one of the second gate drivers, provide data to the pixel unit arranged in the one of the rows scanned by the one of the first gate drivers and arranged in the one of the columns scanned by the one of the second gate drivers.

12. The display according to claim 11, wherein each of the first gate drivers is configured to scan a corresponding row of the pixel units via a corresponding first gate line, and each of the second gate drivers is configured to scan a corresponding column of the pixel units via a corresponding second gate line.

13. The display according to claim 12, wherein the corresponding first gate line extends in a row direction.

14. The display according to claim 12, wherein the corresponding second gate line extends in a column direction.

15. The display according to claim 11, wherein the data driver is configured to provide data to a pixel unit via a data line that serially connects all of the pixel units in the active area.

16. The display according to claim 15, wherein the data line extends in a column direction through pixel units from one column to another.

17. The display according to claim 16, wherein the data line extends in a row direction through pixel units from one row to another.

18. The display according to claim 11, wherein the irregular-shape active area includes one of a triangle, circle, semi-circle, diamond, rhombus, parallelogram and quadrangle.

19. A method of driving a display, the method comprising:
    providing a display that comprises pixel units arranged in rows and columns in an irregular-shape active area;
    selecting pixel units of interest by first gate drivers configured to select one or more pixel units in the rows of pixel units and by second gate drivers configured to select one or more pixel units in the columns of pixel units, wherein each of the selected pixel units of interest is arranged in each of a selected row selected by the first gate drivers and a selected column selected by the second gate drivers; and
    when one of the selected pixel units arranged in one of the rows and one of the columns is selected by each of one of the first gate drivers and one of the second gate drivers, providing data to the one of the selected pixel units of interest, arranged in the one of the rows selected by the one of the first gate drivers and arranged in the one of the columns selected by the one of the second gate drivers, via a data line that serially connecting the pixel units in the irregular-shape active area.

20. The method according to claim 19, wherein selecting pixel units of interest comprises:
    scanning the rows of pixel units by the first gate drivers; and
    scanning the columns of pixel units by the second gate drivers.

* * * * *